(12) United States Patent
Min et al.

(10) Patent No.: US 8,853,768 B1
(45) Date of Patent: Oct. 7, 2014

(54) METHOD OF FABRICATING MONOS SEMICONDUCTOR DEVICE

(71) Applicant: Taiwan Semiconductor Manufacturing Co., Ltd., Hsin-Chu (TW)

(72) Inventors: Chung-Chiang Min, Zhubei (TW); Tsung-Hsueh Yang, Taichung (TW); Shih-Chang Liu, Alian Township (TW); Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/798,393

(22) Filed: Mar. 13, 2013

(51) Int. Cl.
*H01L 29/792* (2006.01)
*H01L 21/336* (2006.01)
*H01L 21/28* (2006.01)

(52) U.S. Cl.
CPC ........ *H01L 29/792* (2013.01); *H01L 21/28282* (2013.01)
USPC .......................................... 257/324; 438/257

(58) Field of Classification Search
CPC ..................... H01L 29/6656; H01L 29/66689; H01L 21/28593; H01L 21/76834
USPC ................................................. 438/257, 261
See application file for complete search history.

(56) References Cited

U.S. PATENT DOCUMENTS

| 6,828,199 | B2 | 12/2004 | Ogura et al. |
| 7,767,522 | B2 * | 8/2010 | Toba et al. ................ 438/257 |
| 8,143,666 | B2 | 3/2012 | Fumitake |
| 2009/0200597 | A1 * | 8/2009 | Sakai ........................ 257/320 |
| 2009/0231921 | A1 * | 9/2009 | Kimura et al. ........... 365/185.18 |
| 2010/0164019 | A1 * | 7/2010 | Jeong ........................ 257/408 |

OTHER PUBLICATIONS

"A Device that Has Traveled in Outer Space—Low-Cost Embedded Nonvolatile Memory Device Technology: MONOS", from Featuring, 4 pages, CX-News vol. 28 1970.

* cited by examiner

*Primary Examiner* — William D Coleman
(74) *Attorney, Agent, or Firm* — Duane Morris LLP

(57) ABSTRACT

A method for fabricating a semiconductor device is provided. The method includes forming a plurality of gate structures having asymmetric sidewalls including a tall side and a short side. Adjacent ones of the plurality of gate structures are separated by a tall side-tall side region and a short side-short side region. The method further comprises forming a spacer layer over the plurality of gate structures and a bottom surface of the tall side-tall side region and the short side-short side region, depositing an oxide layer over the spacer layer, etching the bottom surface portions of the oxide layer, and selectively etching the sidewall portions of the oxide layer in the tall side-tall side region.

20 Claims, 6 Drawing Sheets

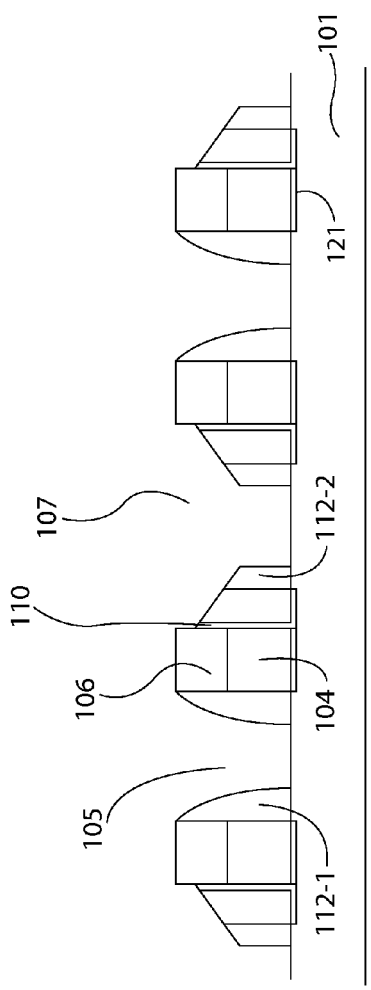
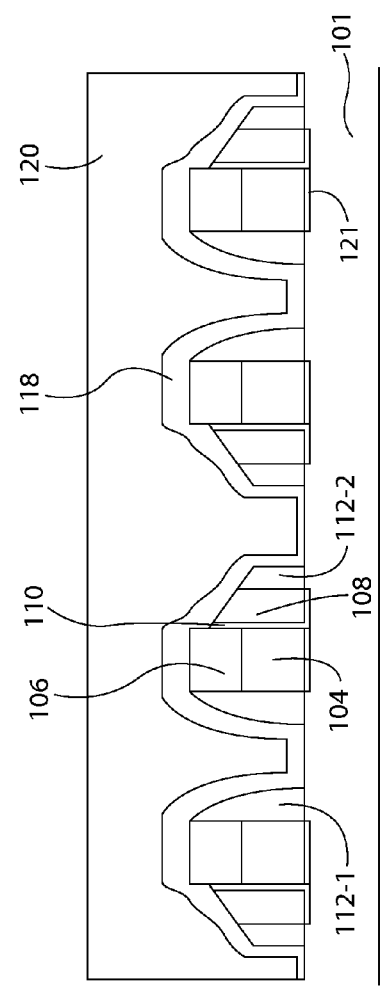

METHOD OF FABRICATING MONOS SEMICONDUCTOR DEVICE

FIELD

This disclosure relates to a method of forming a semiconductor device and the resulting semiconductor device. More particularly, the disclosed subject matter relates to a process for fabrication of a MONOS cell structure of a semiconductor device, and the resulting MONOS device.

BACKGROUND

A metal-oxide-nitride-oxide-semiconductor (MONOS) memory cell is a type of nonvolatile memory device structure. A MONOS cell generally comprises a semiconductor substrate, a channel layer above the semiconductor substrate, source and drain diffusion regions in the surface of the semiconductor substrate, and a gate conductor above the channel layer. An oxide-nitride-oxide (ONO) layer is disposed between the channel layer and the gate conductor. In the ONO layer, a layer of nitride is sandwiched between two insulative layers of oxide.

In a MONOS memory cell, electric charge is stored in traps in the nitride layer, and this stored charge is utilized to store data. MONOS memory devices provide high stability and reliability.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like reference numerals denote like features throughout specification and drawings.

FIGS. 1A-1H illustrate an exemplary method of forming a metal oxide nitride oxide semiconductor (MONOS) device in accordance with some embodiments.

DETAILED DESCRIPTION

Figure 1A:
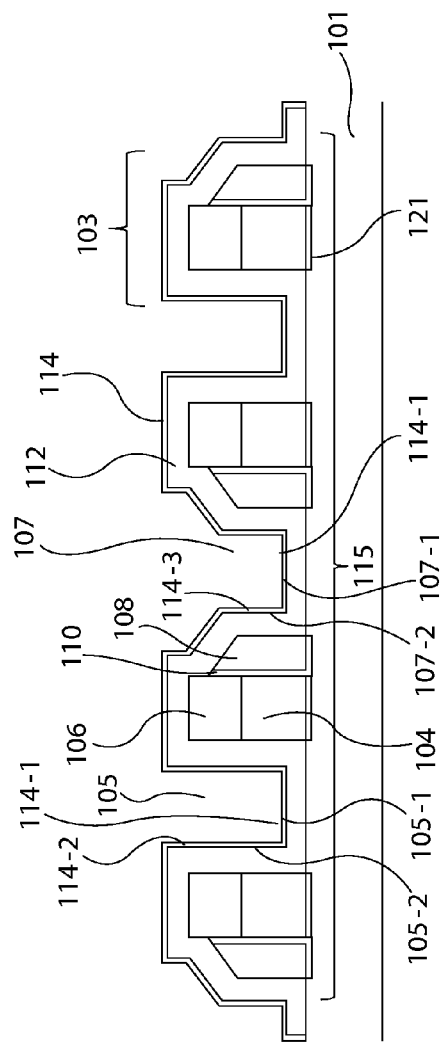

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Semiconductor devices such as MONOS devices and static random access memory (SRAM) semiconductor devices continue to be scaled to smaller size to meet advanced performance targets. Fabrication of devices with such small dimensions involves precise control. For example, semiconductor processing often involves filling a material into a region, a trench or a gap having a high aspect ratio defined by the ratio of a longest dimension such as height to a shortest dimension such as width of the region. Because of such a high aspect ratio, voids may exist inside such a region after the filling step. The voids may be filled with unwanted materials such as conductive material during subsequent fabrication processes. It is desirable to prevent or eliminate such voids during fabrication and provide a good region having a high aspect ratio in a semiconductor device.

The present disclosure provides a method for fabricating a semiconductor device such as a MONOS device or an SRAM device. In some embodiments, the method comprises forming a transistor array structure comprising a plurality of gate structures separated by a plurality of regions. The regions between adjacent gate structures can have a high aspect ratio. The method comprises a step of selectively masking at least one region between adjacent gate structures while leaving at least one region unmasked. The unmasked region is etched before filling the region with a material.

Unless expressly indicated otherwise, references to a "region" separating a plurality of gate structures made in this disclosure will be understood to encompass a space, a trench or a gap between adjacent gate structures. At least one of these regions can have a high aspect ratio, for example, more than 5 in some embodiments. Such aspect ratio is higher than 10 in some embodiments.

In FIGS. 1A-1H, like items are indicated by like reference numerals, and for brevity, descriptions of the structure, provided above with reference to the previous figures, are not repeated. The method described in FIGS. 2A-2B is described with reference to the exemplary structures described in FIGS. 1A-1H. FIGS. 1A-1H illustrate an exemplary method of forming a MONOS device in accordance with some embodiments.

FIGS. 2A-2B are flow diagrams illustrating an exemplary method 200 of forming a semiconductor device such a MONOS device in accordance with some embodiments.

Figure 2A:
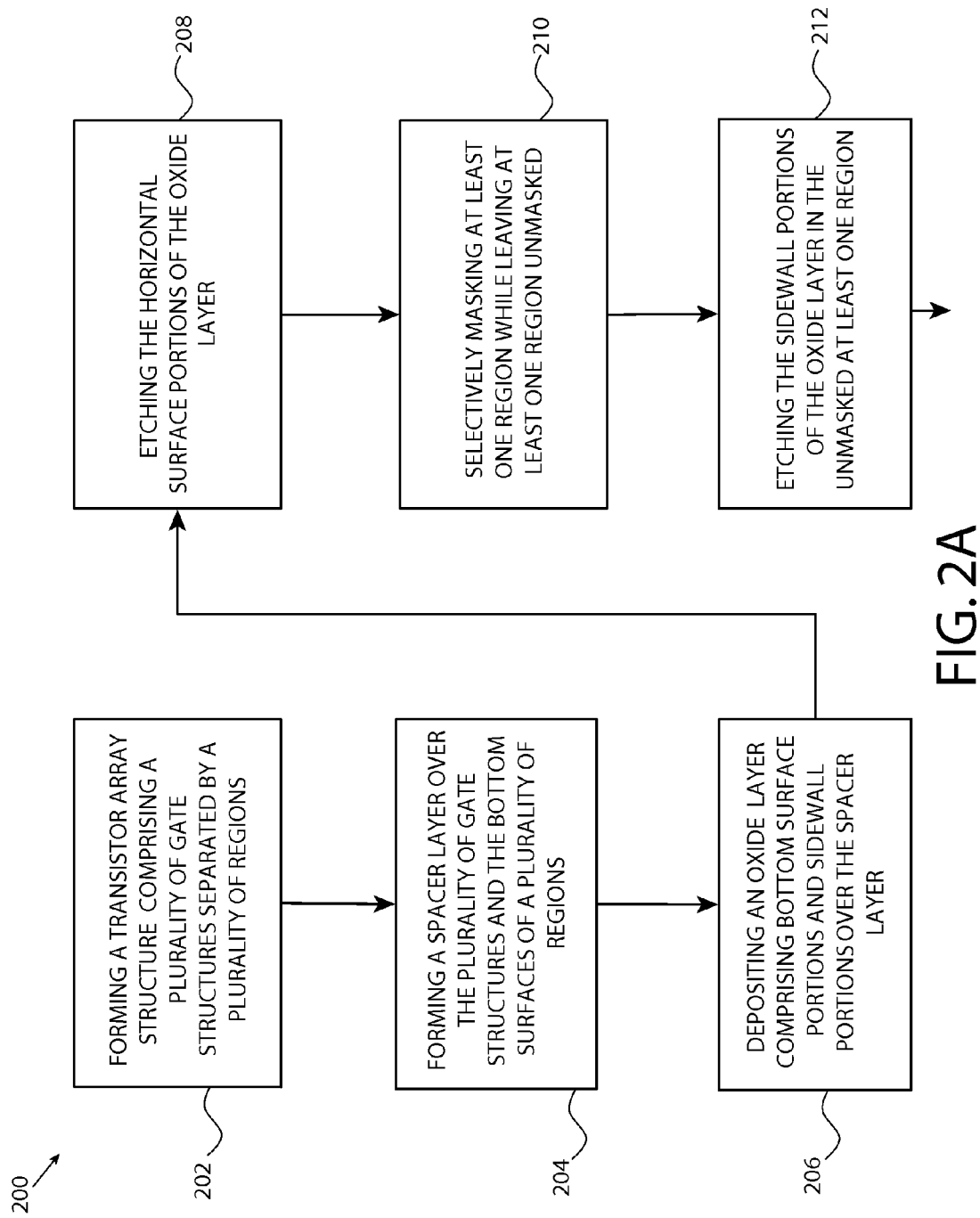
FIGS. 2A-2B are flow diagrams illustrating an exemplary method of forming a semiconductor device in accordance with some embodiments.
Figure 2B:
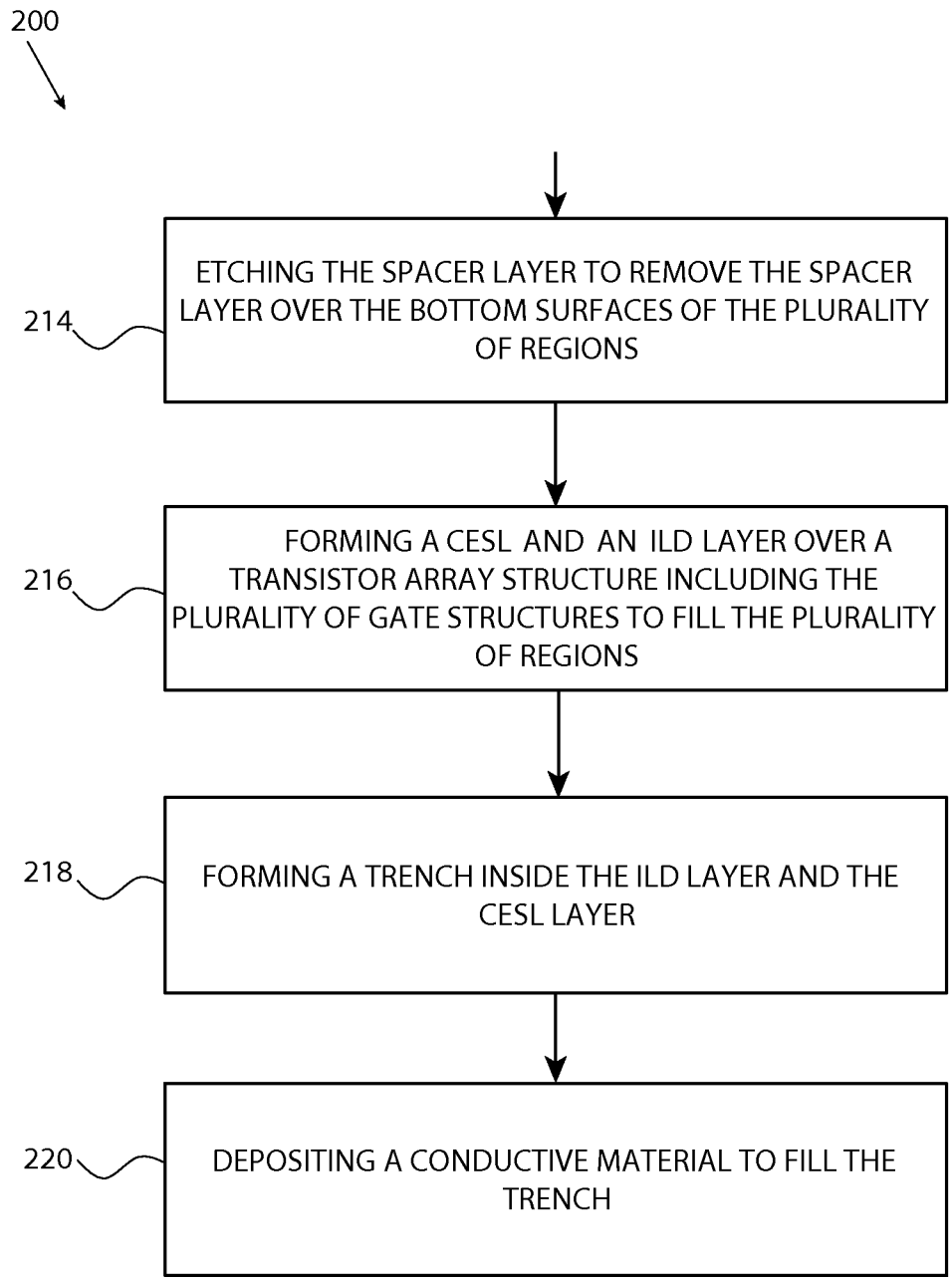

Steps 202-206 form the structure shown in FIG. 1A. For brevity, separate drawings are not provided to show the intermediate structures in steps 202 and 204. At step 202, a transistor array structure 115 comprising a plurality of gate structures 103 is formed over a semiconductor substrate 101. The plurality of gate structures 103 are separated by a plurality of regions 105 and 107.

Substrate 101 can be a wafer comprising a semiconductor material. Examples of suitable materials for substrate 101 include but are not limited to silicon, germanium, a compound semiconductor, and a semiconductor-on-insulator (SOI) substrate. A compound semiconductor can be an III-V semiconductor compound such as gallium arsenide (GaAs). An SOI substrate can comprise a semiconductor on an insulator such as glass.

Two adjacent gate structures 103 are separated by a region 105 or 107. Region 105 or 107 has a bottom surface (105-1 or 107-1) over semiconductor substrate 101 and a side wall (105-2 or 107-2) shared with the at least one gate structure 103. At least one region 105 or 107 has an aspect ratio equal to or higher than 5 or 10, for example, 40 in some embodiments.

In some embodiments, the plurality of gate structures 103 have asymmetric sidewalls including a tall side and a short side as shown in FIG. 1A. Adjacent ones of the plurality of gate structures 103 are separated by a tall side-tall side region 105 and a short side-short side region 107 as shown in FIG. 1A.

The semiconductor device is not limited to any specific type. For example, the plurality of gate structures 103 are included in a metal oxide nitride oxide semiconductor (MONOS) device in some embodiments, or in a static random access memory (SRAM) semiconductor device in some other embodiments.

In some embodiments, the method is used for fabricating a MONOS device. Referring to FIG. 1A, at step 202 of FIG. 2, each respective gate structure 103 in the transistor array structure comprises a control gate 104, a memory gate 108, and an oxide-nitride-oxide (ONO) layer 110 between control gate 104 and memory gate 108. Control gate 104 and memory gate 108 are disposed side-by-side over semiconductor substrate 101. Each gate structure 103 can further comprise a hard mask layer 106 above control gate 104.

Referring to FIG. 1A, control gate 104 comprises any suitable material in any suitable configuration. Examples of suitable materials for control gate 104 include but are not limited to amorphous silicon, polysilicon, polysilicon/germanium. aluminum, copper, titanium, tantalum, tungsten, molybdenum, platinum, tantalum nitride (TaN), titanium nitride (TiN), tungsten nitride (WN), titanium aluminum (TiAl), titanium aluminum nitride (TiAlN), TaCN, TaC, TaSiN, other conductive material, or combinations thereof. The conductive material of the control gate 104 can be doped or undoped. In some embodiments, control gate 104 comprises polysilicon.

Memory gate 108 can also comprise any suitable material in any suitable configuration. Examples of suitable materials for memory gate 108 include but are not limited to amorphous silicon, polysilicon, polysilicon/germanium, aluminum, copper, titanium, tantalum, tungsten, molybdenum, platinum, tantalum nitride (TaN), titanium nitride (TiN), tungsten nitride (WN), titanium aluminum (TiAl), titanium aluminum nitride (TiAlN), TaCN, TaC, TaSiN, other conductive material, or combinations thereof. The conductive material of memory gate 108 can be doped or undoped. In some embodiments, memory gate 108 comprises polysilicon.

Oxide-nitride-oxide (ONO) layer 110 comprises a three-layer structure including a nitride layer sandwiched between two oxide layers. The nitride layer comprises silicon nitride while the oxide layer comprises silicon oxide in some embodiments. The ONO layer 110 is disposed between control gate 104 and memory gate 108. The ONO layer 110 is also disposed underneath memory gate 108 in some embodiments, as shown in FIG. 1A.

As shown in FIG. 1A, hard mask 106 is disposed over control gate 104 in some embodiments. Examples of a suitable material for hard mask 106 include but are not limited to silicon oxide, silicon nitride (e.g., $Si_3N_4$), SiON, SiC, SiOC, or any combination thereof. An one example, hard mask 106 comprises silicon nitride.

Step 202 in method 200 can also comprise forming other portions (not shown) of a semiconductor device on or above semiconductor substrate 101, besides control gate 104 and memory gate 108. For example, the other portions can include one or more of a buffer layer, an isolator layer or isolation structure such as a shallow trench isolation (STI) structure, channel layers, source regions, drain regions and gate dielectric layers such as a gate oxide layer 121 underneath control gate 104. The method comprises in-situ doping to form a source region and a drain region in the surface of substrate 101 in some embodiments.

Other portions can include source regions, channel layers and drain regions (not shown). For example, in some embodiments, memory gate 108 is disposed over a source region of the respective gate structure 103. Control gate 104 is disposed over a drain region of the respective gate structure 103. Adjacent gate structures 103 share a source region or a drain region; and each of the plurality of regions 105 and 107 is alternatingly over a source region or a drain region. For example, region 105 is above a drain region while region 107 is above a source region in FIG. 1A. Region 105 has a high aspect ratio, for example, higher than 5 or 10 in some embodiments. Region 105 is the tall side-tall side region while region 107 is the short side-short side region. Region 105 has an aspect ratio of higher than 40 in some embodiments. The ONO layer 110 can be further disposed between a memory gate 108 and a channel layer (not shown) of the memory gate 108 in some embodiments.

At step 204, a spacer layer 112 is formed over the plurality of gate structures 103 and the bottom surfaces of a plurality of regions 105 and 107. Spacer layer 112 can be formed of oxides, nitrides, oxynitrides, combinations thereof and other suitable insulating materials. In some embodiments, spacers are formed of silicon nitrides (e.g., $Si_3N_4$). Spacer layer 112 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating.

At step 206 of FIG. 2, a conformal oxide layer 114 is deposited over spacer layer 112. A suitable material for oxide layer 114 comprises silicon oxide in some embodiments. Oxide layer 114 can be formed by an isotropic deposition process including, for example, CVD, PECVD, ALD or any other isotropic deposition techniques. Oxide layer 114 comprises bottom surface portions 114-1 over the bottom surfaces of the plurality of regions 105 and 107, and sidewall portions (114-2 and 114-3) over the spacer layer 112 along a side wall of the plurality of regions 105 and 107. The structure of the semiconductor device after step 206 is illustrated in FIG. 1A.

Figure 1B:
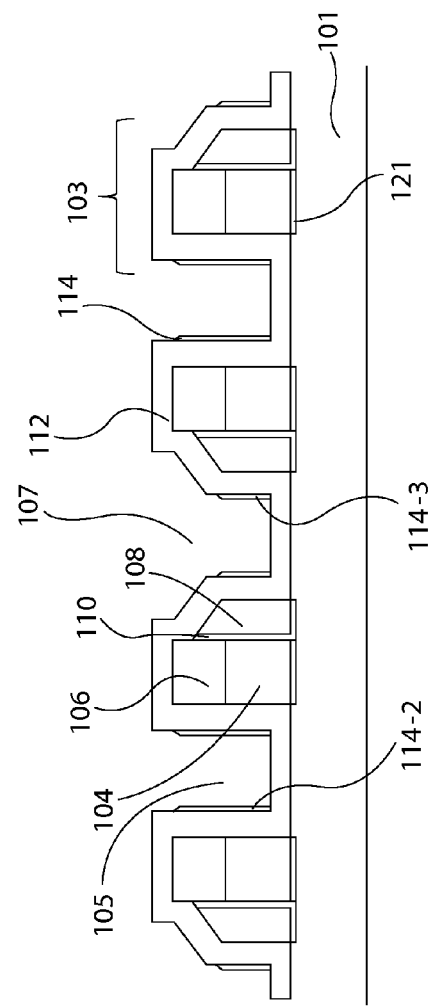

At step 208, the horizontal portions of oxide layer 114 (including bottom surface portions over the bottom surfaces of the plurality of regions 105 and 107) are etched by an anisotropic etch. The anisotropic etch leaves the vertical sidewall portions of layer 114 substantially intact. The structure of the semiconductor device after step 208 is illustrated in FIG. 1B. Examples of a suitable etching process include but are not limited to plasma etching and any other suitable technique. A directional etching process is desirable at step 206. Portions of oxide layer 114 on a horizontal surface are etched away while the sidewall portions over the spacer layer 112 along a side wall of the plurality of regions 105 and 107 are not removed.

At step 210, exemplary method 200 comprises selectively masking at least one region while leaving at least one region unmasked. The structure of the semiconductor device after step 210 is illustrated in FIG. 1C.

Figure 1C:
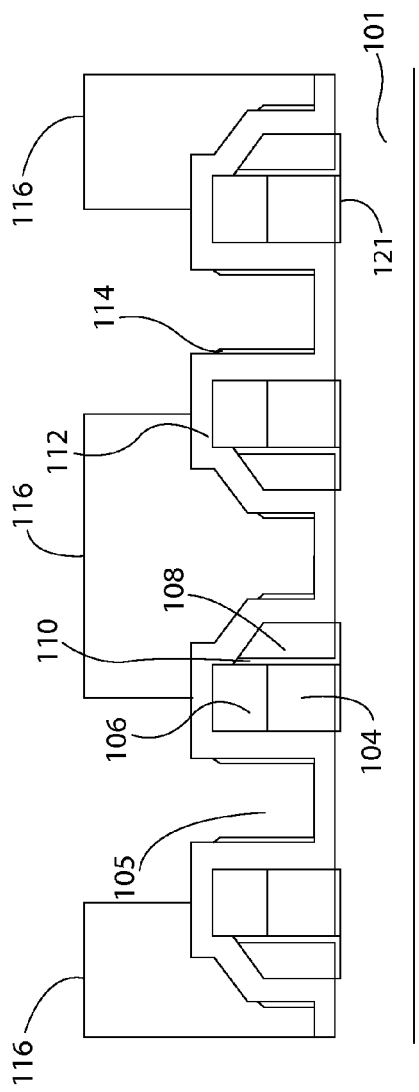

As shown in FIG. 1C, at least one of the plurality of regions 105 and 107 can be masked. In some embodiments, the unmasked at least one region, for example, 105 in FIG. 1C, has a high aspect ratio. The unmasked at least one region can have an aspect ratio equal to or higher than, 10 or 20 in some embodiments. The unmasked region can have an aspect ratio equal to or higher than 40 in some embodiments. In some embodiments, the short side-short side region 107 is selectively masked. The tall side-tall side region 105 is left unmasked. The unmasked tall side-tall side region 105 has an aspect ratio equal to or higher than 40.

Taking a MONOS device described for step 202 as an example, in some embodiments, ones of the plurality of regions 107 over a source region are masked and ones of the plurality of regions over drain regions 105 are not masked in step 210 of selectively masking. Regions 105 have an aspect ratio equal to or high than 40 in some embodiments.

The step of selectively masking at least one region is performed using a photoresist material 116 (FIG. 1C) in some embodiments. In such a fabrication process, a photoresist is used for patterning. Photoresist patterning includes process steps such as photoresist coating, softbaking, mask aligning, pattern exposing, photoresist development, and hard baking.

Figure 1D:
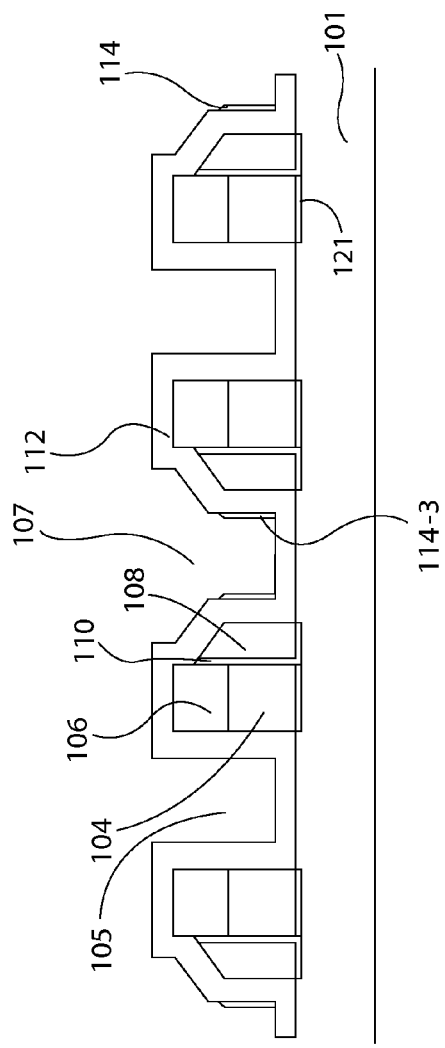

At step 212, an etching process is performed to remove the sidewall portions of oxide layer 114 in the at least one unmasked region 105. The etching process at step 212 can be performed by a suitable etch process having an isotropic etch component. Examples of a suitable etching process include but are not limited to plasma etching, reactive ion etching and wet etching. Examples of suitable plasma include but are not limited to plasma comprising fluorine or fluorine compounds. After etching the sidewall portions of oxide layer 114, photoresist 116 is removed through dry or wet etching, stripping and/or other cleaning processes. In some embodiments, photoresist 116 is completely removed through a wet removal process. For example, photoresist 116 can be stripped by a solution comprising an ingredient such as $H_2SO_4$, $H_2O_2$, and $NH_4OH$. The structure of the semiconductor device after step 212 including possible photoresist removal is illustrated in FIG. 1D.

At step 214 (FIG. 2B), a process of etching spacer layer 112 is performed on spacer layer 112 over the bottom surfaces of the plurality of regions 105 and 107. The structure of the semiconductor device after step 214 is illustrated in FIG. 1E. Such a process of etching can be performed using dry etching, wet etching or any other suitable technique. Examples of a suitable etching process include but are not limited to using plasma, for example, fluorine-containing plasma.

At step 216, a contact etching stop layer (CESL) 118 and an interlayer dielectric (ILD) layer 120 are formed over a transistor array structure including the plurality of gate structures 103. The CESL 118 is deposited first. The ILD layer 120 is then formed over the CESL 118. The ILD layer 120 fills the plurality of regions 105 and 107. The structure of the semiconductor device after step 216 is illustrated in FIG. 1F.

The CESL 118 can be formed of silicon nitride, silicon oxynitride, silicon carbide, silicon oxycarbide, combinations thereof, or other suitable materials. In some embodiments, the CESL 118 is formed of silicon nitride. The CESL 118 can be formed by using chemical vapor deposition (CVD), high density plasma CVD, sputtering, or other suitable method.

Examples of suitable materials for the ILD layer 120 include but are not limited to silicon oxide, silicon oxynitride, phosphosilicate galss (PSG), borophosphosilicate glass (BPSG), combinations thereof, or other suitable material. The ILD layer 120 can be formed by using CVD, high density plasma CVD, spin-on, sputtering, or other suitable method.

Figure 1G:
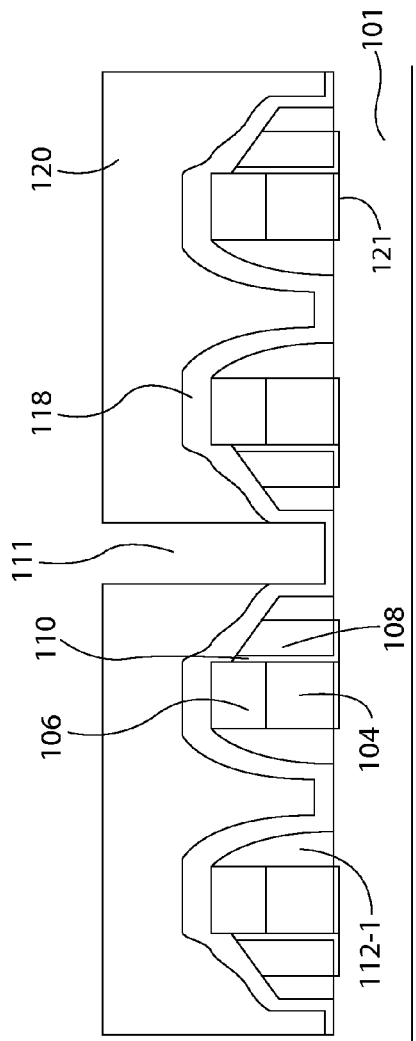

At step 218, a trench 111 is formed inside the ILD layer 120 and the CESL 118. The structure of the semiconductor device after step 218 is illustrated in FIG. 1G. A trench 109 can be formed inside the CESL 118 and the ILD layer 120 through a suitable process, for example, photoresist patterning. In some embodiments, the step of forming trench 111 includes a dry etch process. For example, a suitable photoresist can be applied and exposed to UV light or other irradiation under a mask. After the photoresist is developed, a portion of the CESL 118 and a portion of the ILD layer 120 are removed to form a trench 111 as shown in FIG. 1G.

Figure 1H:
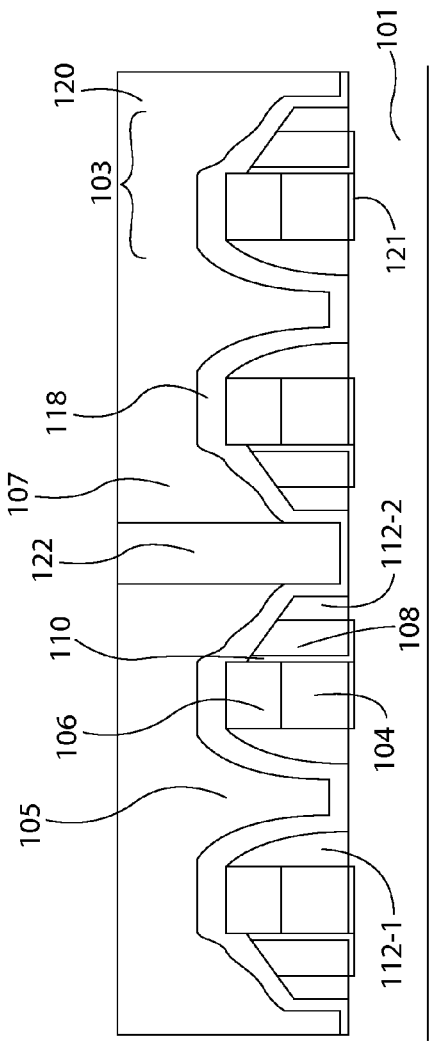

At step 220, a conductive material 122 is deposited to fill trench 111 to form a contact. The structure of the semiconductor device after step 220 is illustrated in FIG. 1H. Examples of a suitable material 122 include but are not limited to tungsten and copper. Although FIG. 1H only shows one contact 122, any number of contacts 122 can be formed.

For example, in some embodiments, each source/drain region has a contact 122 formed by this process.

In some embodiments, when step 210 of selective masking is not used, the ILD layer 120 may contain undesirable voids or tunnels formed inside regions 105 having a high aspect ratio. After step 220, conductive material 122 may fill such voids or tunnels, causing defects. In some embodiments, when step 210 of selective masking is used, the ILD layer 120 does not contain voids or defects.

The present disclosure also provides a semiconductor device. An exemplary device 100 is shown in FIG. 1F. The exemplary device 100 comprises a transistor array structure 115 over a semiconductor substrate 101. The transistor array structure 115 comprises a plurality of gate structures 103 having asymmetric sidewalls including a tall side and a short side. Adjacent gate structures 103 are separated by a tall side-tall-side region 105 and a short side-short side region 107. The device 100 further comprises a spacer layer 112 (including 112-1 and 112-2) disposed along the sidewalls of the tall side-tall-side region 105 and the short side-short side region 107. The spacer layer 112-1 disposed along the sidewalls of the tall side-tall side region 105 has a curved surface. The spacer layer 112-2 disposed along the sidewalls of the short side-short side region 107 can have a sharp corner in some embodiment. In some embodiments, spacer layer 112-1 can have a thickness thinner than that of spacer layer 112-2. In some embodiments, the tall side-tall side region 105 has an aspect ratio equal to or higher than 40. In some embodiments, device 100 is a metal oxide nitride oxide semiconductor (MONOS) device. Each gate structure 103 comprises a control gate 104, a memory gate 108, and an oxide-nitride-oxide (ONO) layer 110 between control gate 104 and memory gate 108. Control gate 104 is disposed adjacent to the short side-short side region 107 and memory gate 104 is disposed adjacent to the tall side-tall side region 107. In some embodiments, device 100 further comprises a hard mask layer 106 above control gate 104, a CESL layer 118 over the transistor array structure 115, an ILD layer 120 over the transistor array structure 115 and inside the tall side-tall-side region 105 and the short side-short side region 107, a conductive material 122 filled in a trench inside the ILD layer 120 and the CESL layer 118.

The present disclosure provides a method for fabricating a semiconductor device. In some embodiments, the method comprises forming a plurality of gate structures having asymmetric sidewalls including a tall side and a short side. Adjacent ones of the plurality of gate structures are separated by a tall side-tall side region and a short side-short side region. The plurality of gate structures are included in a metal oxide nitride oxide semiconductor (MONOS) device in some embodiments. The plurality of gate structures are included in a static random access memory (SRAM) semiconductor device in some other embodiments.

The method further comprises forming a spacer layer over the plurality of gate structures and a bottom surface of the tall side-tall side region and the short side-short side region, and depositing an oxide layer over the spacer layer. The oxide layer comprises bottom surface portions, and sidewall portions over the spacer layer tall side-tall side region and the short side-short side region. The method further comprises etching the bottom surface portions of the oxide layer, and selectively etching the sidewall portions of the oxide layer in the tall side-tall side region. In some embodiments, the method comprises selectively masking the short side-short side region while leaving the tall side-tall side region unmasked, before selectively etching the sidewall portion of the oxide layer. The unmasked tall side-tall side region has an aspect ratio equal to or higher than 40 in some embodiments. The step of selectively masking at least one region is performed using a photoresist material in some embodiments.

In some embodiments, the method further comprises etching the spacer layer to remove the spacer layer over the bottom surfaces of the tall side-tall side region and the short side-short-side region, and forming a contact etching stop layer (CESL) and an interlayer dielectric (ILD) layer over a transistor array structure including the plurality of gate structures to fill the plurality of regions. In some embodiments, the method further comprises forming a trench inside the ILD layer and the CESL layer, and depositing a conductive material to fill the trench.

In some embodiments, a method in this disclosure is a method for fabricating a semiconductor device such as a MONOS device. The method comprises forming a transistor array structure over a semiconductor substrate. The transistor array structure comprises a plurality of gate structures separated by a plurality of regions. Adjacent gate structures are separated by a region having a bottom surface over the semiconductor substrate and a side wall shared with the at least one gate structure.

The method further comprises forming a spacer layer over the plurality of gate structures and the bottom surfaces of the plurality of regions, and depositing an oxide layer over the spacer layer. The oxide layer comprises bottom surface portions over the bottom surfaces of the plurality of regions, and sidewall portions over the spacer layer along a side wall of the plurality of regions. The method further comprises etching the bottom surface portions of the oxide layer over the bottom surfaces of the plurality of regions; selectively masking at least one region while leaving at least one region unmasked, and etching the sidewall portions of the oxide layer in the unmasked at least one region. The unmasked at least one region has an aspect ratio equal to or higher than 40 in some embodiments. The step of selectively masking at least one region can be performed using a photoresist material.

In some embodiments, each respective gate structure in the transistor array structure comprises a control gate, a memory gate, and an oxide-nitride-oxide (ONO) layer between the control gate and the memory gate. The control gate and the memory gate are disposed side-by-side over the semiconductor substrate. Each gate structure can further comprise a hard mask layer above the control gate. In some embodiments, the memory gate is disposed over a source region of the respective gate structure. The control gate is disposed over a drain region of the respective gate structure. Adjacent gate structures share a source region or a drain region; and each of the plurality of regions is alternatingly over a source region or a drain region. In some embodiments, ones of the plurality of regions over a source region are masked and ones of the plurality of regions over a drain region are not masked in the step of selectively masking at least one of the plurality of the regions.

In some embodiments, the method for fabricating a MONOS device further comprises etching the spacer layer to remove the spacer layer over the bottom surfaces of the plurality of regions, and forming a CESL and an ILD layer over the transistor array structure to fill the plurality of regions, forming a trench inside the ILD layer and the CESL layer, and depositing a conductive material to fill the trench.

In another aspect, the present disclosure provides a semiconductor device. The semiconductor device comprises a transistor array structure over a semiconductor substrate. The transistor array structure comprises a plurality of gate structures having asymmetric sidewalls including a tall side and a short side. Adjacent gate structures are separated by a tall side-tall-side region and a short side-short side region. The device further comprises a spacer layer disposed along the sidewalls of the tall side-tall-side region and the short side-short side region. The spacer layer disposed along the sidewalls of the tall side-tall side region has a curved surface. In some embodiments, the tall side-tall side region has an aspect ratio equal to or higher than 40. In some embodiments, the device is a metal oxide nitride oxide semiconductor (MONOS) device. Each gate structure comprises a control gate, a memory gate, and an oxide-nitride-oxide (ONO) layer between the control gate and the memory gate. The control gate is disposed adjacent to the short side-short side region and the memory gate is disposed adjacent to the tall side-tall side region. In some embodiments, the device further comprises a hard mask layer above the control gate, a contact etching stop layer (CESL) over the transistor array structure, an interlayer dielectric (ILD) layer over the transistor array structure and inside the tall side-tall-side region and the short side-short side region, a conductive material filled in a trench inside the ILD layer and the CESL layer.

Although the subject matter has been described in terms of exemplary embodiments, it is not limited thereto. Rather, the appended claims should be construed broadly, to include other variants and embodiments, which may be made by those skilled in the art.

What is claimed is:

1. A method for fabricating a semiconductor device, comprising:
   forming a plurality of gate structures having asymmetric sidewalls including a tall side and a short side, wherein adjacent ones of the plurality of gate structures are separated by a tall side-tall side region and a short side-short side region;
   forming a spacer layer over the plurality of gate structures and a bottom surface of the tall side-tall side region and the short side-short side region;
   depositing an oxide layer over the spacer layer, the oxide layer comprising bottom surface portions and sidewall portions in the tall side-tall side region and the short side-short side region;
   etching the bottom surface portions of the oxide layer; and
   selectively etching the sidewall portions of the oxide layer over the spacer layer in the tall side-tall side region.

2. The method of claim 1, further comprising:
   etching the spacer layer to remove the spacer layer over the bottom surfaces of the tall side-tall side region and the short side-short side region; and
   forming a contact etching stop layer (CESL) and an interlayer dielectric (ILD) layer over a transistor array structure including the plurality of gate structures.

3. The method of claim 1, further comprising
   selectively masking the short side-short side region while leaving the tall side-tall side region unmasked, before selectively etching the sidewall portion of the oxide layer, wherein the unmasked tall side-tall side region has an aspect ratio equal to or higher than 40.

4. The method of claim 1, wherein
   the plurality of gate structures are included in a metal oxide nitride oxide semiconductor (MONOS) device.

5. The method of claim 1, wherein
   the plurality of gate structures are included in a static random access memory (SRAM) semiconductor device.

6. The method of claim 2, further comprising:
   forming a trench inside the ILD layer and the CESL layer; and
   depositing a conductive material to fill the trench.

7. The method of claim 3, wherein
the step of selectively masking is performed using a photoresist material.

8. A method for fabricating a semiconductor device, comprising:
forming a transistor array structure over a semiconductor substrate, the transistor array structure comprising a plurality of gate structures separated by a plurality of regions, adjacent gate structures separated by a region having a bottom surface over the semiconductor substrate and a side wall shared with the at least one gate structure;
forming a spacer layer over the plurality of gate structures and the bottom surfaces of the plurality of regions;
depositing an oxide layer over the spacer layer, the oxide layer comprising bottom surface portions over the bottom surfaces of the plurality of regions, and sidewall portions over the spacer layer along a side wall of the plurality of regions;
etching the bottom surface portions of the oxide layer over the bottom surfaces of the plurality of regions;
selectively masking at least one region while leaving at least one region unmasked; and
etching the sidewall portions of the oxide layer in the unmasked at least one region.

9. The method of claim 8, wherein
each respective gate structure in the transistor array structure comprises a control gate, a memory gate, and an oxide-nitride-oxide (ONO) layer between the control gate and the memory gate, the control gate and the memory gate disposed side-by-side over the semiconductor substrate.

10. The method of claim 8, wherein
the step of selectively masking at least one of the plurality of the regions is performed using a photoresist material.

11. The method of claim 8, wherein
the unmasked at least one region has an aspect ratio equal to or higher than 40.

12. The method of claim 8, further comprising:
etching the spacer layer to remove the spacer layer over the bottom surfaces of the plurality of regions; and
forming a contact etching stop layer (CESL) and an interlayer dielectric (ILD) layer over the transistor array structure to fill the plurality of regions.

13. The method of claim 9, wherein
each gate structure further comprises a hard mask layer above the control gate.

14. The method of claim 9, wherein
the memory gate is disposed over a source region of the respective gate structure;
the control gate is disposed over a drain region of the respective gate structure;
adjacent gate structures share a source region or a drain region; and
each of the plurality of regions is alternatingly over a source region or a drain region.

15. The method of claim 14, wherein ones of the plurality of regions over a source region are masked and ones of the plurality of regions over a drain region are not masked in the step of selectively masking at least one of the plurality of the regions.

16. The method of claim 12, further comprising:
forming a trench inside the ILD layer and the CESL layer; and
depositing a conductive material to fill the trench.

17. A semiconductor device, comprising:
a transistor array structure over a semiconductor substrate, the transistor array structure comprising a plurality of gate structures having asymmetric sidewalls including a tall side and a short side, wherein adjacent gate structures are separated by a tall side-tall-side region and a short side-short side region; and
a spacer layer disposed along the sidewalls of the tall side-tall-side region and the short side-short side region, wherein the spacer layer disposed along the sidewalls of the tall side-tall side region has a curved surface extending from a top surface to a bottom surface of the tall side-tall side region.

18. The device of claim 17, wherein
the tall side-tall side region has an aspect ratio equal to or higher than 40.

19. The device of claim 17, wherein
the device is a metal oxide nitride oxide semiconductor (MONOS) device; and
each gate structure comprises a control gate, a memory gate, and an oxide-nitride-oxide (ONO) layer between the control gate and the memory gate;
the control gate is disposed adjacent to the short side-short side region and the memory gate is disposed adjacent to the tall side-tall side region.

20. The device of claim 19, further comprising:
a hard mask layer above the control gate;
a contact etching stop layer (CESL) over the transistor array structure;
an interlayer dielectric (ILD) layer over the transistor array structure and inside the tall side-tall-side region and the short side-short side region;
a conductive material filled in a trench inside the ILD layer and the CESL layer.

* * * * *